US012707597B2

(12) United States Patent
Weis

(10) Patent No.: US 12,707,597 B2
(45) Date of Patent: Aug. 11, 2026

(54) COOLING DEVICE FOR COOLING A SEMICONDUCTOR MODULE AND CONVERTER WITH THE COOLING DEVICE

(71) Applicant: Siemens Aktiengesellschaft, Munich (DE)

(72) Inventor: Benno Weis, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 369 days.

(21) Appl. No.: 18/285,058

(22) PCT Filed: Feb. 16, 2022

(86) PCT No.: PCT/EP2022/053770
§ 371 (c)(1),
(2) Date: Sep. 29, 2023

(87) PCT Pub. No.: WO2022/207179
PCT Pub. Date: Oct. 6, 2022

(65) Prior Publication Data
US 2024/0188254 A1 Jun. 6, 2024

(30) Foreign Application Priority Data
Mar. 31, 2021 (EP) .................................... 21166370

(51) Int. Cl.
*H05K 7/20* (2006.01)

(52) U.S. Cl.
CPC ....... *H05K 7/2039* (2013.01); *H05K 7/20909* (2013.01); *H05K 7/20927* (2013.01)

(58) Field of Classification Search
None
See application file for complete search history.

(56) References Cited

U.S. PATENT DOCUMENTS 4,027,206 A 5/1977 Lee
4,103,737 A * 8/1978 Perkins ................ H01L 23/467 165/122

(Continued)

FOREIGN PATENT DOCUMENTS

CN 108966482 A 12/2018
DE 202021100332 U1 2/2021

(Continued)

OTHER PUBLICATIONS

PCT International Preliminary Report on Patentability mailed Mar. 20, 2023 corresponding to PCT International Application No. PCT/EP2022/053770 filed Feb. 16, 2022.

*Primary Examiner* — Courtney L Smith
(74) *Attorney, Agent, or Firm* — Henry M. Feiereisen LLC

(57) ABSTRACT

A cooling apparatus includes a semiconductor module having first and second cover faces, with the first cover face facing away from the second cover face, a module space between the first and second cover faces, and side faces to enclose the module space. A heat sink cools the semiconductor module and includes a base body. Cooling elements project from a first face of the base body and a cooling medium flows around the cooling elements and the side faces of the semiconductor module in a flow direction along the base body, with a first one of the side faces and a second one of the side faces of the semiconductor module forming a common side edge which faces the flow direction. The semiconductor module is connected to the first face of the base body at the first cover face and is embedded between at least some of the cooling elements.

18 Claims, 4 Drawing Sheets

(56) References Cited

U.S. PATENT DOCUMENTS

| | | | | |
|---|---|---|---|---|
| 4,765,400 | A * | 8/1988 | Chu | H01L 23/4338 361/689 |
| 5,077,601 | A * | 12/1991 | Hatada | H01L 23/467 174/15.1 |
| 6,678,157 | B1 * | 1/2004 | Bestwick | H05K 7/20163 165/104.34 |
| 7,310,228 | B2 * | 12/2007 | Chen | H05K 7/20154 361/679.48 |
| 8,913,385 | B2 * | 12/2014 | Downing | H01L 23/467 361/679.48 |
| 9,648,779 | B2 * | 5/2017 | Kohn | G06F 1/20 |
| 9,750,159 | B2 * | 8/2017 | Campbell | H05K 7/20809 |
| 10,548,239 | B1 * | 1/2020 | Iyengar | H05K 7/20763 |
| 10,939,586 | B2 | 3/2021 | Van Der Veer et al. | |
| 11,382,241 | B2 * | 7/2022 | Gao | H05K 7/20772 |
| 12,439,554 | B2 * | 10/2025 | Chen | H05K 7/20236 |
| 2010/0315780 | A1 * | 12/2010 | Murakami | H05K 7/20927 361/699 |
| 2014/0126150 | A1 * | 5/2014 | Song | H01L 23/473 361/699 |
| 2018/0310396 | A1 | 10/2018 | Kobayashi et al. | |

FOREIGN PATENT DOCUMENTS

| | | | |
|---|---|---|---|
| GB | 2502148 | A | 11/2013 |
| KR | 20110041014 | A | 4/2011 |

* cited by examiner 134
128
128
101
126
109, 110
114
112, 113
103, 108
109, 110
114
109, 110
114
106
109, 110
114
105
104
125
132
124, 129
117
117
107
117
106
102
117
136
117
122
114
109, 110
130
135
137
123

COOLING DEVICE FOR COOLING A SEMICONDUCTOR MODULE AND CONVERTER WITH THE COOLING DEVICE

CROSS-REFERENCES TO RELATED APPLICATIONS

This application is the U.S. National Stage of International Application No. PCT/EP20222/053770, filed Feb. 16, 2022, which designated the United States and has been published as International Publication No. WO 2022/207179 A1 and which claims the priority of European Patent Application, Serial No. 21166370.3, filed Mar. 31, 2021, pursuant to 35 U.S.C. 119(a)-(d).

BACKGROUND OF THE INVENTION

The invention relates to a cooling apparatus having a semiconductor module for cooling the semiconductor module and a converter having the cooling apparatus.

In practically all areas of application in industry and power generation/power distribution, the requirements for a more compact construction of electrical devices, and in drive technology for a more compact construction of electrical converters, can hardly be ignored if economic and technical success is to be achieved by offering and using these electrical devices.

For example, there is a need for modularized and structured solutions for converters with regard to their electrical dimensioning, their specialized application tasks or also their local installation limitations.

For example, converters can have a plurality of converter modules and converter systems can have a plurality of converters, which can be similar in their functionality and electrical dimensioning but can also have differences. Standardized coupling mechanisms, for example by means of backplane buses, should and can bring such converters or converter systems very close together technically and spatially.

However, this makes it necessary to arrange at least all technically relevant components of the converter as compactly as possible on or in a converter.

An example of this is the Siemens SINAMICS S120 converter series of the book size structure. As the name suggests, the converter or also its converter modules have a book shape with regard to the geometric or illustrative construction. The height and depth of the structure of this converter series are currently essentially fixed, but the width can vary. Accordingly, the width offers potential for further minimizing the installation space.

Assemblies in converters that often still require a proportionally large installation space are heat sinks or cooling apparatuses for dissipating heat from electrical or electronic components in combination with these components The minimum width of said converter series is still mainly determined by the arrangement of the cooling apparatus with the heat sink and the semiconductor module which is connected to the heat sink for operational heat dissipation. In this context, a semiconductor module is understood to be both a semiconductor module having a single semiconductor but also a semiconductor module in the form of a bridge circuit having a plurality of semiconductors—such as in a six-pulse bridge circuit (B6 bridge). Typical semiconductors are IGBTs (Insulated-Gate Bipolar Transistor), which are designed as power semiconductors, or MOSFETs (Metal Oxide Semiconductor Field-Effect Transistor).

Currently known construction technologies of existing cooling apparatuses still require too much space from the point of view of both manufacturers and users, for example in order to open up new technical areas of application by means of smaller, decentrally arranged converters or to use converters or converter modules in a more finely granular way with regard to their performance data and their functionality.

The invention is based on the object of proposing a cooling apparatus for cooling a semiconductor module, and a converter having the cooling apparatus, which require less space in comparison to the state of the art.

SUMMARY OF THE INVENTION

The object is achieved by a cooling apparatus 1 as set forth hereinafter and by a converter as set forth hereinafter.

In order to achieve the object, a cooling apparatus having a semiconductor module and a heat sink for cooling the semiconductor module is proposed, wherein the semiconductor module has a first and second cover face and a plurality of side faces, wherein the first cover face faces away from the second cover face, wherein a module space of the semiconductor module is formed between the cover faces, said module space being enclosed by the side faces, wherein the heat sink has a base body, wherein cooling elements are formed on a first face of the base body and said cooling elements project from the base body, wherein the semiconductor module is connected to the first face of the base body at the first cover face, and the semiconductor module is embedded between at least some of the cooling elements.

By embedding the semiconductor module between the cooling elements, the construction volume and thus the space requirement of the construction in accordance with the invention consisting of heat sink, cooling elements and semiconductor module is reduced in an advantageous manner compared to a known construction in which the cooling elements are not formed on the first face of the base body, said first face being designated as the mounting face of the semiconductor module, and said cooling elements are thus not arranged together with the semiconductor module by means of this special construction topology.

The term embedding is understood here in the spatial sense to also mean an encompassing, enclosing, surrounding or limiting of the semiconductor module, in particular on its side faces, by the cooling elements. An embedding space thus created for the semiconductor module is at least also limited by the first face of the base body of the heat sink.

A single semiconductor or a plurality of semiconductors, for example in the form of a B6 bridge circuit, can be arranged in the module space formed in the semiconductor module.

The number of side faces which also form the module space is not limited, but at least three side faces are provided.

Advantageous embodiments of the capacitor apparatus are disclosed in the dependent claims.

In a first advantageous embodiment of the cooling apparatus, the cooling elements are designed as cooling fins or pin fins or as a combination of cooling fins and pin fins.

The term pin fin is a term technically established in the meantime in connection with heat sinks. This designates pin-like bulges on heat sinks, which in comparison to conventional cooling fins can usually be distributed on a surface of a heat sink as individual pin fins smaller and more finely granular.

By means of conventional cooling fins, a convection current can generally be directed advantageously in a channel-like manner in one direction over the heat sink, wherein pin fins can also advantageously thin out a convection current at specific points by means of their fine-granular arrangement possibility or can intensify it by generating local vortices.

Depending on the requirements of, for example, the structure of the semiconductor module to be cooled, cooling fins, pin fins or a combination of both cooling elements can be more effective.

In a further advantageous embodiment of the cooling apparatus, the semiconductor module is connected at its second cover face to a component support element, in particular a printed circuit board.

An electrical connection of the semiconductor module is usually made via the component support element, preferably the printed circuit board.

The advantageous arrangement of the semiconductor module between the first face of the base body and the component support element further reduces the space required for connecting the semiconductor module to the heat sink in an advantageous manner.

A busbar or other electrical conductor to which the then semiconductor module is attached can also be used as the component support element.

In a further advantageous embodiment of the cooling apparatus, the cooling apparatus has a cooling element cover, wherein the cooling elements each form a cooling element end that faces away from the base body and at least some of the cooling elements are connected to the cooling element cover at their cooling element end.

By means of the cooling element cover, directed cooling channels can be better sealed off from the environment of the cooling apparatus, whereby convection can be guided in a more targeted manner at least past the side faces of the semiconductor module and the semiconductor module can thus be advantageously cooled.

In another advantageous embodiment of the cooling apparatus, the cooling element cover is made of the same metal material as the base body of the heat sink and/or the cooling elements.

The cooling element cover thus also has the usually very good thermal cooling properties of the base body and/or of the cooling elements due to the metal shaping, so that an improved dissipation of the heat loss that is generated during operation of the semiconductor module can be advantageously implemented to the environment of the cooling apparatus.

In a further advantageous embodiment of the cooling apparatus, the heat sink is monolithically formed from the base body, the cooling elements and the cooling element cover.

The monolithic construction presented in this way enables a cooling apparatus that can be manufactured in a compact and industrially cost-effective manner.

Since the semiconductor module is embedded between the cooling elements and connected to the first face of the base plate, a recess can be provided in the cover plate for inserting the semiconductor module during the manufacture of the cooling apparatus.

In a further advantageous embodiment of the cooling apparatus, the cooling element cover is formed as a component support element, in particular as a printed circuit board.

It is a basic functionality of the component support element/in particular the printed circuit board to provide electronic and electrotechnical components, such as the semiconductor module, with an electrical and mechanical connection within an electrical device, such as the converter. Accordingly, the component support element/printed circuit board is generally an inherent part of the system of converters. The combination with another function, that of covering the cooling elements, advantageously reduces the space required for the cooling apparatus and can help to advantageously reduce the dimensions and thus the installation volume of converters.

The use of the component support element/printed circuit board as a cooling element cover can make it necessary to electrically insulate the component support element/printed circuit board from the cooling elements.

In a further advantageous embodiment of the cooling apparatus, a cooling medium can flow around the cooling elements and the side faces of the semiconductor module in a flow direction along the base body.

The cooling elements are aligned and arranged in such a way that the semiconductor module to be cooled is arranged with as large a face area as possible, in particular its side faces, in the direction of flow and can thus be advantageously flowed around and cooled by the cooling medium.

In a further advantageous embodiment of the cooling apparatus, the cooling medium is liquid, in particular water, or gaseous, in particular air.

In a further advantageous embodiment of the cooling apparatus, at least a first and a second side face of the side faces of the semiconductor module form a common side edge and the common side edge of the first and second side face faces the flow direction.

The cooling medium flowing in the direction of flow can break at the side edge, so that it divides and in this case, for example, can flow around both side faces of the semiconductor module in an advantageous manner.

In a further advantageous embodiment of the cooling apparatus, an edge angle at the common side edge between the first and second side face has a value in an angular range of 30° to 60°, in particular 45°.

It is shown that the edge angle in the range of 30° to 60° makes the flow around the side faces particularly effective, since on the one hand the cooling medium does not build up on the side faces, and on the other hand the cooling medium does not flow too quickly past the side faces without being able to sufficiently absorb the heat loss and transport it away from the semiconductor module. A preferred value for the edge angle is 45°, which is structurally predetermined in the case of a four-sided, rectangular semiconductor module.

In a further advantageous embodiment of the cooling apparatus, a maximum cooling element length of the cooling elements which are formed on the first face of the base body, starting from the first face of the base body to the cooling element end of the respective cooling element, is limited by a cover face distance between the first cover face and the second cover face of the semiconductor module.

One of the determining components for an overall width of the cooling apparatus is the semiconductor module. Since it is a component that is usually commercially available in its specific dimensions and is thus predetermined, the cooling elements in particular must be oriented to the predetermined dimensions of the semiconductor module.

The cover faces mentioned here represent, in addition to the side faces, the outer dimensions of the semiconductor module, wherein electrical connections for the contacting of the semiconductor module or also mechanical fastening means can be excluded from this consideration.

In a further advantageous embodiment of the cooling apparatus, cooling elements are not provided on a second face of the base body that faces away from the first face of the base body.

A formation of cooling elements on the second face of the base body of the heat sink is advantageously dispensed with, since the reduction of the size and thus of the construction volume of the cooling apparatus is thus particularly effective.

For achieving the object, a converter having the cooling apparatus in accordance with the invention and a converter housing is further proposed, wherein the cooling apparatus is integrated into the converter housing.

The use of the cooling apparatus in accordance with the invention in the converter, with integration into the converter housing, significantly reduces in particular the installation space width of the converter housing and thus of the converter.

In an advantageous embodiment of the converter, forced convection of the cooling medium can be generated by a convection generator.

The forced convection forces the cooling of the semiconductor module, since the cooling medium can be transported to the semiconductor module which is to be cooled in a more targeted manner, faster and in a larger volume and can be transported away from the semiconductor module while absorbing the heat loss of the semiconductor module which occurs during operation.

BRIEF DESCRIPTION OF THE DRAWING

The above described characteristics, features and advantages of this invention and the manner in which these are achieved are more clearly and more precisely understandable in conjunction with the following description of the exemplary embodiments that are explained in detail in connection with the figures. In the drawings:

FIG. 2 shows a first schematic representation as a section through a cooling apparatus in accordance with the invention, which is integrated in a converter housing of a converter in accordance with the invention.

DETAILED DESCRIPTION OF PREFERRED EMBODIMENTS

Figure 1:
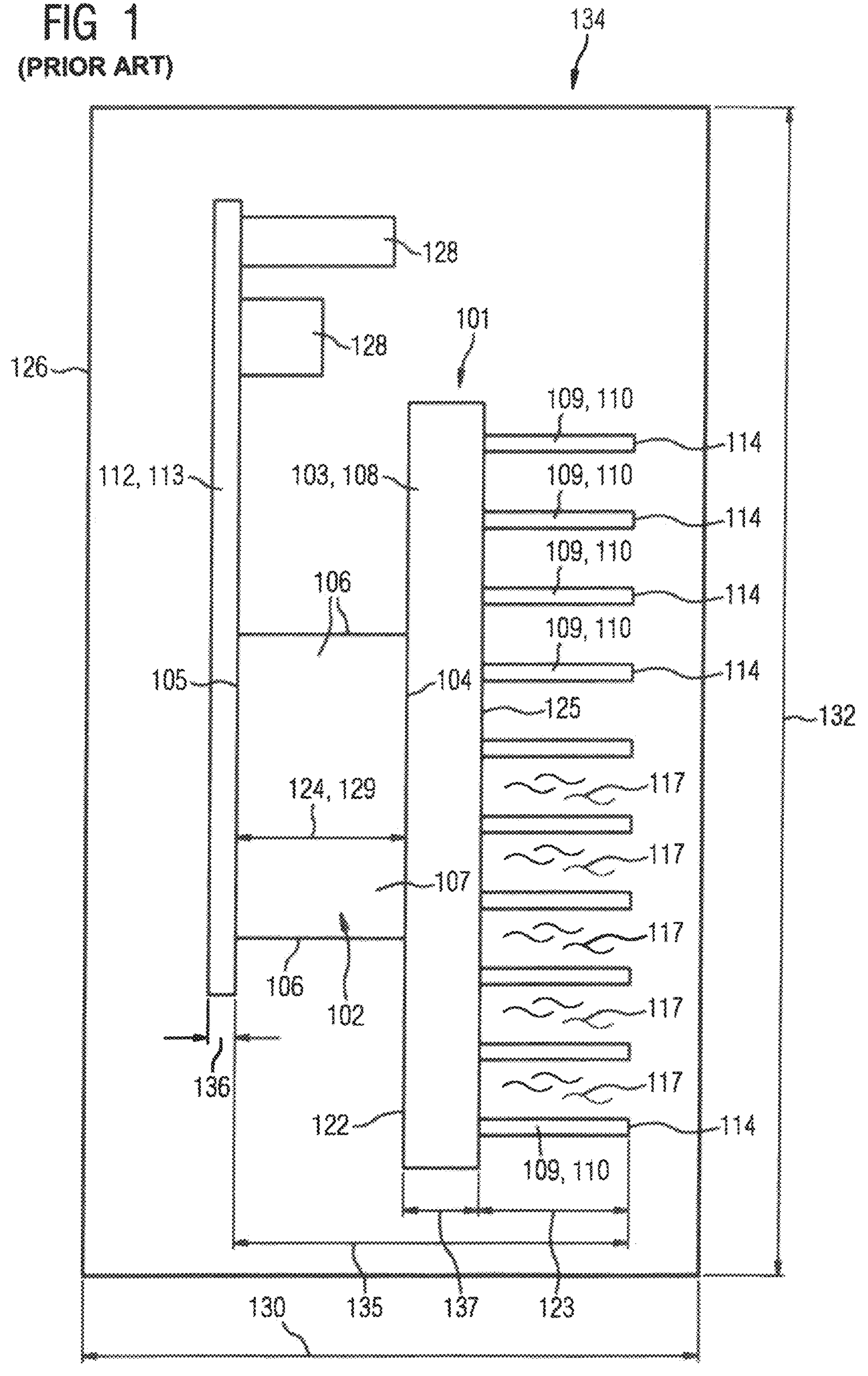
FIG. 1 shows a schematic representation as a section through a known cooling apparatus, which is integrated in a converter housing of a converter.

FIG. 1 shows a schematic sectional view of a known cooling apparatus 101, which is integrated into a converter housing 126 of a converter 134.

On a first face 122 of a base body 108 of a heat sink 103, a semiconductor module 102 is connected to the base body 108 via its first cover face 104. The semiconductor module 102 is further connected to a component support element 112, in this case a printed circuit board 113, via its second cover face 105.

The semiconductor module 102 forms a module space 107 which is determined by the first and second cover faces 104,105 and the side faces 106.

The component support element 112/printed circuit board 113 has further electronic components 128, which are arranged away from the cooling apparatus 101 but are integrated with the component support element 112/printed circuit board 113 in the converter housing 126 of the converter 134.

Cooling elements 109 in the form of cooling fins 110 which project orthogonally from the base body 108 in this case are formed on a second face 125 of the base body 108 of the cooling apparatus 103, which faces away from the first face 104 of the base body 108. A cooling medium 117 flows around the cooling elements 109 and the second face 125 of the base plate 108 of the heat sink 103.

The illustration of the converter housing 126 of the converter 134 shows a view of the converter housing 126, which reveals a housing width 130 and a housing height 132 of the converter housing 126.

The housing width 130 of the converter housing 126 of the converter 124 is, as FIG. 1 also apparently shows, substantially determined by a cooling apparatus width 135 of the cooling apparatus 101.

This cooling apparatus width 135 sums a module height 129 of the semiconductor module 102, a second thickness 137 of the base body 108 of the heat sink 103 and a maximum cooling element length 123 of the cooling elements 109, in this case the cooling fins 110.

In so doing, the module height 129 is determined by the cover face distance 124 of the first cover face 104 from the second cover face 105, and the maximum cooling element length 123 is determined by a distance of the second face 125 of the base body 108 from a cooling element end 114 that is assigned to the respective cooling element 109, which in each case faces away from the second face 125 of the base body 108.

The first thickness 136 of the component support element 112, in this case the printed circuit board 113, can be added to the cooling apparatus width 135 in order to be able to make a comparison with the housing width 130 of the converter housing 126.

Figure 2:
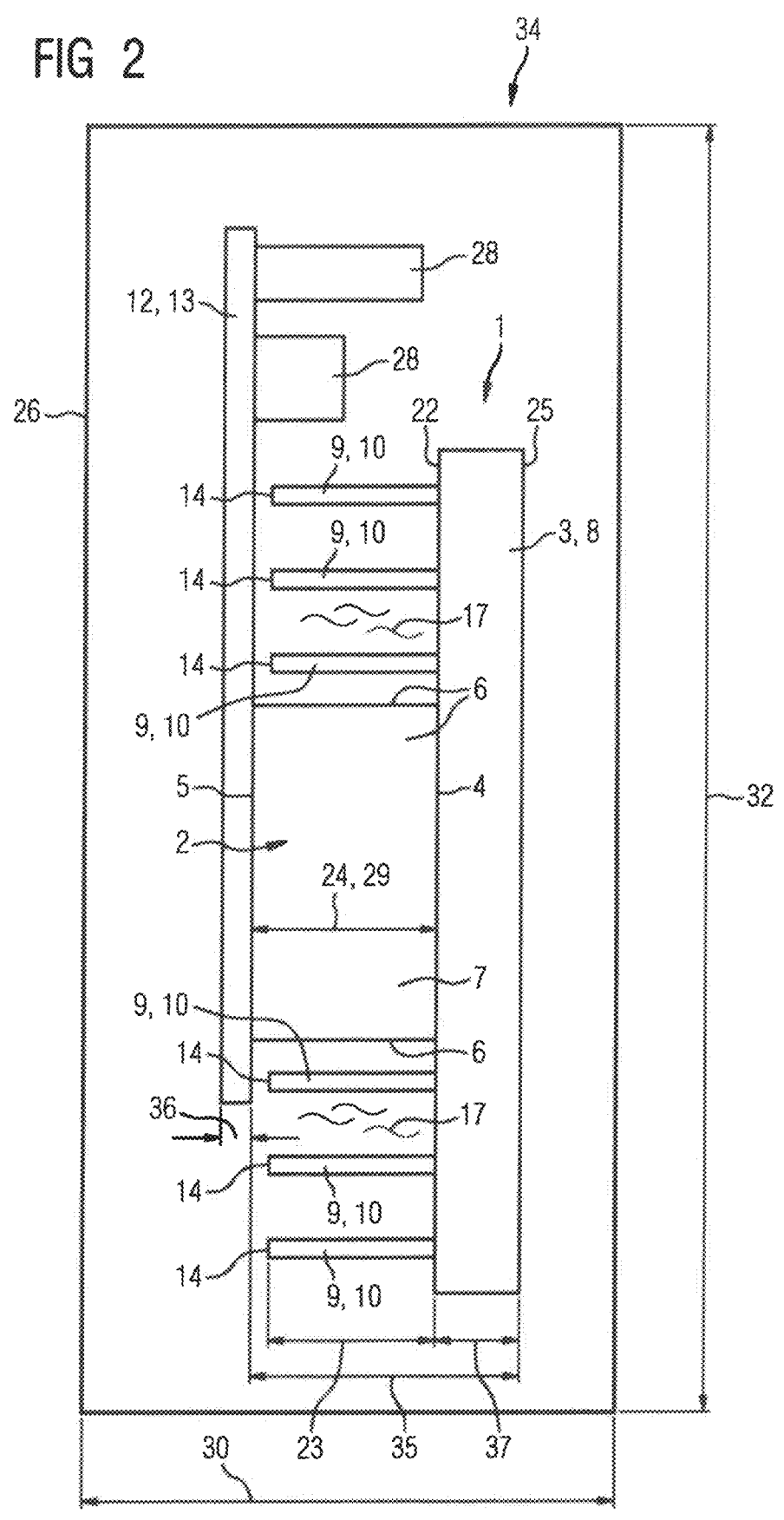

With FIG. 2, a first schematic sectional view of a cooling apparatus 1 in accordance with the invention is shown, which is integrated in a converter housing 26 of a converter 34 in accordance with the invention.

On a first face 22 of a base body 8 of a heat sink 3, a semiconductor module 2 is connected to the base body 8 via its first cover face 4. The semiconductor module 2 is furthermore connected via its second cover face 5 to a component support element 12, in this case a printed circuit board 13.

The semiconductor module 2 forms a module space 7 which is determined by the first and second cover faces 4,5 and the side faces 6.

The component support element 12/printed circuit board 13 has further electronic components 28 which are arranged away from the cooling apparatus 1 but are integrated with the component support element 12/printed circuit board 13 in the converter housing 6 of the converter 4.

Also formed on the first face 22 of the base body 8 of the heat sink 3 are cooling elements 9 in the form of cooling fins 10, which project orthogonally from the base body 8 in this case, whereby the semiconductor module 2 is embedded by the cooling elements 9.

A cooling medium 17 flows around both the semiconductor module 2 and also the cooling elements 9 and the first face 22 of the base body 8 of the heat sink 3.

Cooling elements are not formed or otherwise mounted on a second face 25 of the base body 8 of the heat sink 3, which faces away from the first face 22 of the base body 8.

The illustration of the converter housing 26 of the converter 34 shows a view of the converter housing 26, which reveals a housing width 30 and a housing height 32 of the converter housing 26.

The housing width 30 of the converter housing 26 of the converter 24 is, as FIG. 2 also apparently shows, substantially determined by a cooling apparatus width 35 of the cooling apparatus 1.

This cooling apparatus width 35 sums up a module height 29 of the semiconductor module 2 and a second thickness 37 of the base body 8 of the heat sink 3. The cooling elements 9 are smaller in this case in terms of their maximum cooling element length 23 than the module height 29 of the semiconductor module 2. The cooling element length 23 therefore does not exceed the module height 29 of the semiconductor module 2 and therefore also does not influence the determined cooling apparatus width 35 of the cooling apparatus 1.

The module height 29 is determined by the cover face distance 24 of the first cover face 4 from the second cover face 5. The maximum cooling element length 23 of the cooling elements 9 is determined by a distance of the first face 22 of the base body 8 from a cooling element end 14 that is assigned to the respective cooling element 9, which in each case faces away from the first face 22 of the base body 8.

The first thickness 36 of the component support element 12, in this case the printed circuit board 13, can be added to the cooling apparatus width 35 in order to be able to make a comparison with the housing width 30 of the converter housing 26.

A comparison of the cooling apparatus width 35 of the cooling apparatus 1 in accordance with the invention of FIG. 2 with the cooling apparatus width 135 of the known cooling apparatus 101 of FIG. 1 also apparently shows that the cooling apparatus width 35 of the cooling apparatus 1 in accordance with the invention of FIG. 2 is significantly reduced compared to the cooling apparatus width 135 of the known cooling apparatus 101 of FIG. 1.

Thus, the housing width 30 of the converter housing 26 of the converter 34 in accordance with the invention, as shown in FIG. 2, can be significantly reduced compared to the housing width 130 of the converter housing 126 of the known converter 134, as shown in FIG. 1.

Figure 3:
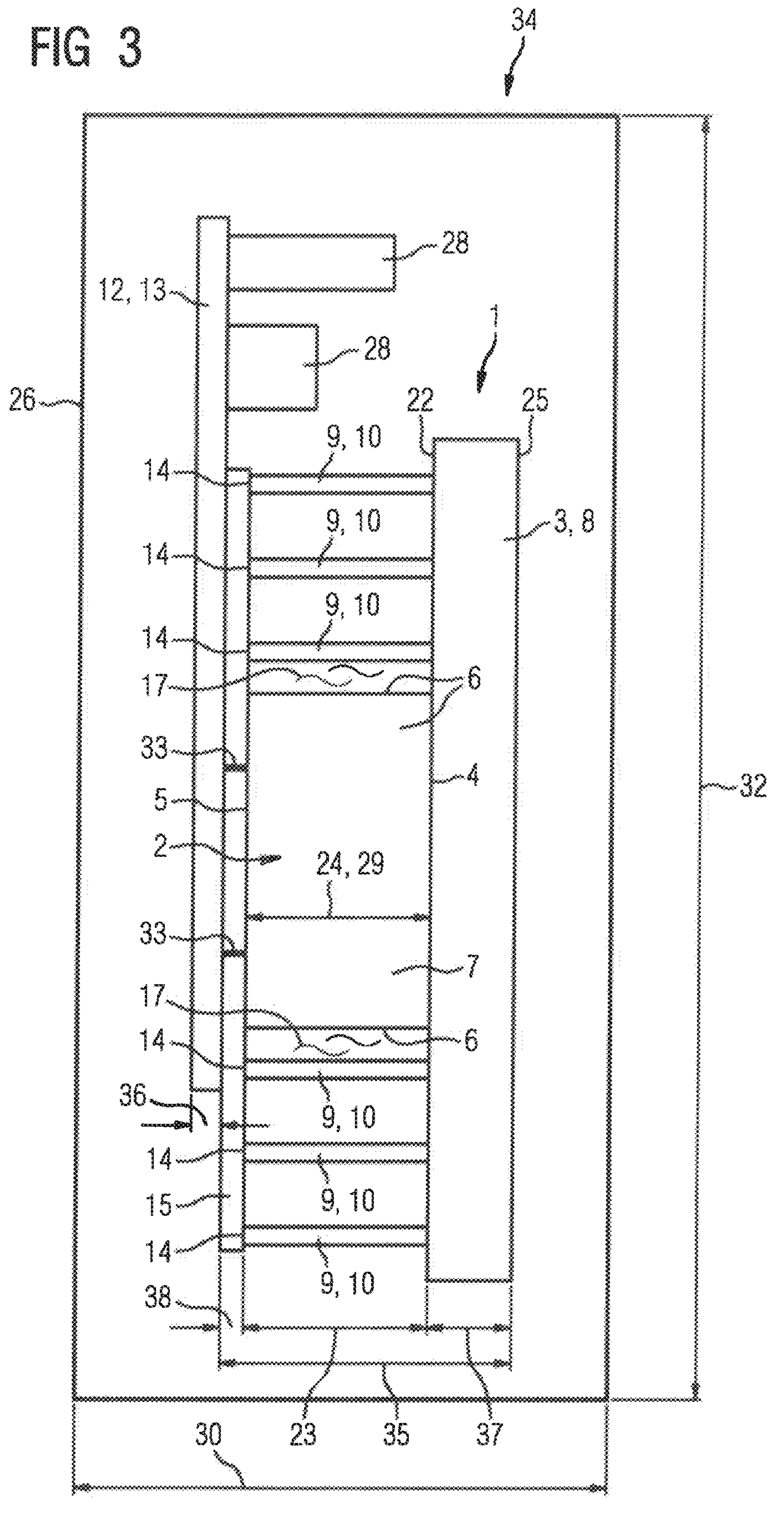
FIG. 3 shows a second schematic representation as a section through the cooling apparatus in accordance with the invention, which is integrated in the converter housing of the converter in accordance with the invention as shown in FIG. 2

By means of FIG. 3, a second schematic sectional view is shown of the cooling apparatus 1 in accordance with the invention integrated in the converter housing 26 of the converter 34 in accordance with the invention according to FIG. 2.

The second schematic sectional view of FIG. 3 corresponds substantially to the first schematic sectional view of FIG. 2, thus FIG. 3 can be considered analogously to FIG. 2, but with the difference that the cooling apparatus 1 comprises a cooling element cover 15.

This cooling element cover 15 is connected to the cooling elements 9, in this case the cooling fins 10, via their cooling element ends 14. In this application example, the cooling element cover 15 also extends over the semiconductor module 2 and is connected here to the semiconductor module 2 via the second cover face 5 of the semiconductor module 2.

In contrast to FIG. 2, the semiconductor module 2 is only connected at its second cover face 5 to the component support element 12, in this case the printed circuit board 13, via two electrical plated through-holes 33 shown as an example.

The illustration of the converter housing 26 of the converter 34 in FIG. 3 also shows a view of the converter housing 26, which reveals a housing width 30 and a housing height 32 of the converter housing 26.

The housing width 30 of the converter housing 26 of the converter 24 is, as FIG. 3 also apparently shows, substantially determined by a cooling apparatus width 35 of the cooling apparatus 1.

This cooling apparatus width 35 sums the module height 29 of the semiconductor module 2, the second thickness 37 of the base body 8 of the heat sink 3 and a third thickness 38 of the cooling element cover 15. Here, the cooling elements 9 are the same size in terms of their maximum cooling element length 23 as the module height 29 of the semiconductor module 2.

The module height 29 is determined by the cover face distance 24 of the first cover face 4 from the second cover face 5. The maximum cooling element length 23 of the cooling elements 9 is determined by a distance of the first face 22 of the base body 8 from a cooling element end 14 which is assigned to the respective cooling element 9, which in each case faces away from the first face 22 of the base body 8.

The first thickness 36 of the component support element 12, in this case the printed circuit board 13, can be added to the cooling apparatus width 35 in order to be able to make a comparison with the housing width 30 of the converter housing 26.

Also, a comparison of the cooling apparatus width 35 of the cooling apparatus 1 in accordance with the invention of FIG. 3 with the cooling apparatus width 135 of the known cooling apparatus 101 of FIG. 1 apparently shows that the cooling apparatus width 35 of the cooling apparatus 1 in accordance with the invention of FIG. 3 is significantly reduced compared to the cooling apparatus width 135 of the known cooling apparatus 101 of FIG. 1.

Thus, the housing width 30 of the converter housing 26 of the converter 34 in accordance with the invention, as shown in FIG. 3, can also be significantly reduced compared to the housing width 130 of the converter housing 126 of the known converter 134, as shown in FIG. 1.

Figure 4:
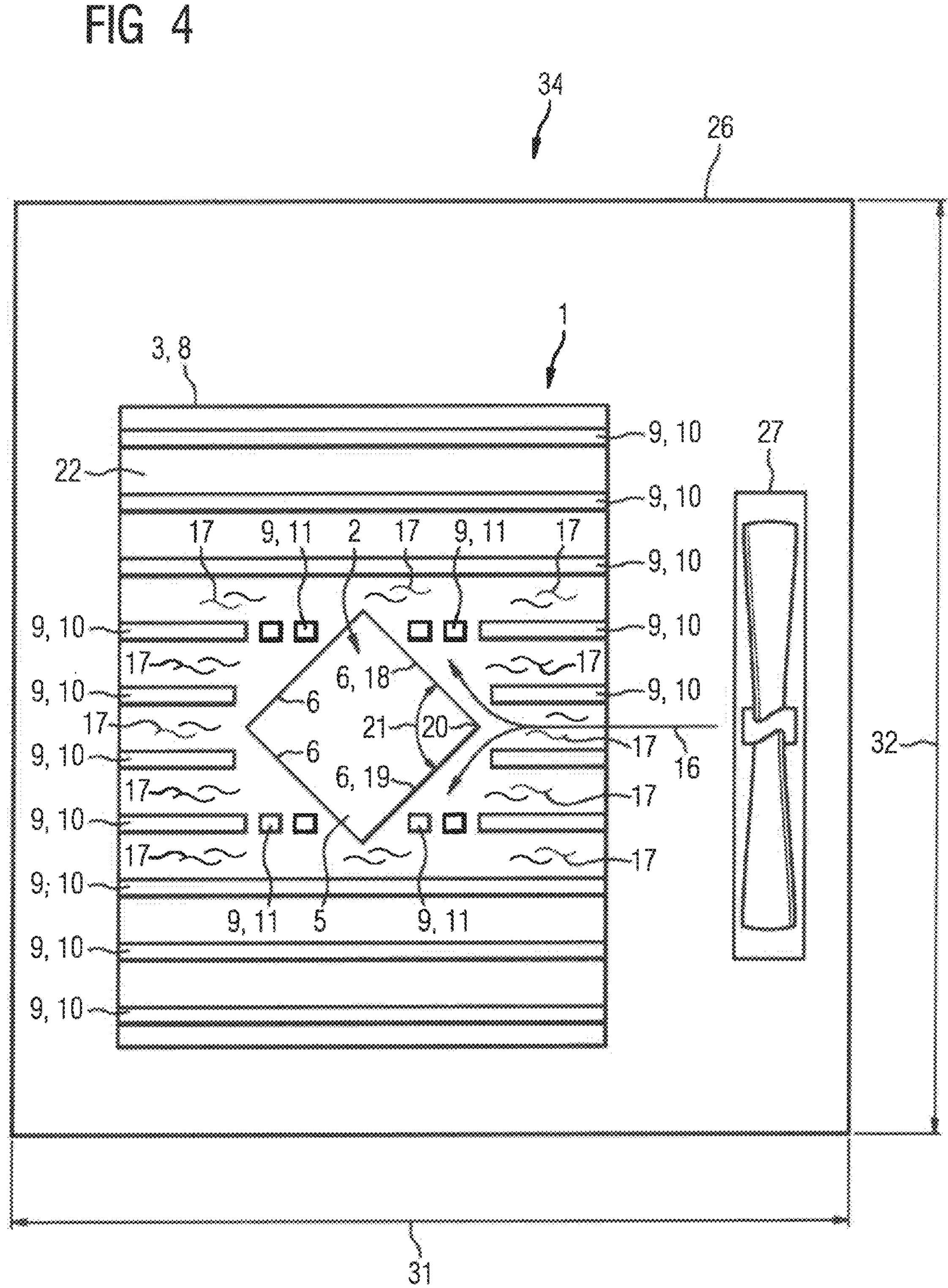
FIG. 4 shows a schematic detailed representation of the cooling apparatus in accordance with the invention, which is integrated in the converter housing of the converter in accordance with the invention according to FIG. 2 and FIG. 3.

FIG. 4 shows a schematic detailed view of the cooling apparatus 1 in accordance with the invention which is integrated in the converter housing 26 of the converter 34 in accordance with the invention as shown in FIG. 2 and FIG. 3.

The cooling apparatus 1 is shown here in a lateral view. Cooling elements 9 are formed in a combination of cooling fins 10 and pin fins 11 on the first face 22 of the base plate 8 of the heat sink 3. The semiconductor module 2 which is connected to the first face 22 of the base plate 8 is embedded in the cooling elements 9.

A cooling medium 17 which is flowing through the cooling elements 9 in a flow direction 16 flows around the cooling elements 9 and the semiconductor module 2, in particular its side faces 6.

A first side face 18 of the side faces 6 forms a common side edge 20 with the second side face 19 of the side faces 6, said side edge 20 facing the flow direction 16, wherein the manner in which the first side face (18) faces the second side face 18,19 is determined by an edge angle 21.

This edge angle 21 influences the flow direction 16 when the cooling medium 17 flows past the first and second side faces 18,19 of the semiconductor module 2 and thus the cooling of the cooling medium 17 on the first and second side faces 18,19 of the semiconductor module 2.

A convection generator 27, for example a fan for the cooling medium 17, which is gaseous, or a pump for the cooling medium 17, which is liquid, generates a forced convection of the cooling medium 17 along the flow direction 16.

The schematic detail illustration shows a specific view of the converter housing 26 of the converter 34, which reveals a housing depth 31 and a housing height 32 of the converter housing 26.

The invention claimed is:

1. A cooling apparatus, comprising:

a semiconductor module comprising a first cover face, a second cover face, with the first cover face facing away from the second cover face, a module space formed between the first and second cover faces, and a plurality of side faces designed to enclose the module space;

a heat sink designed to cool the semiconductor module and comprising a base body;

cooling elements formed on a first face of the base body and designed to project from the base body; and a cooling medium capable of flowing around the cooling elements and the plurality of side faces of the semiconductor module in a flow direction along the base body, with at least a first one of the plurality of side faces and a second one of the plurality of side faces of the semiconductor module forming a common side edge which faces the flow direction, wherein the semiconductor module is connected to the first face of the base body at the first cover face and designed for embedment between at least some of the cooling elements.

2. The cooling apparatus of claim 1, wherein the cooling elements are formed as cooling fins or as pin fins or a combination of cooling fins and pin fins.

3. The cooling apparatus of claim 1, further comprising a component support element or a cooling element cover, said semiconductor module being connected at the second cover face to the component support element or to the cooling element cover.

4. The cooling apparatus of claim 3, wherein the component support element is a printed circuit board.

5. The cooling apparatus of claim 3, wherein the cooling elements each form a cooling element end that faces away from the base body, with at least some of the cooling elements being connected at the cooling element end to the cooling element cover.

6. The cooling apparatus of claim 3, wherein the cooling element cover is made of a same metal material as the base body of the heat sink and/or the cooling elements.

7. The cooling apparatus of claim 3, wherein the heat sink is monolithically formed from the base body, the cooling elements and the cooling element cover.

8. The cooling apparatus of claim 3, wherein the cooling element cover is formed as a further component support element.

9. The cooling apparatus of claim 8, wherein the further component support element is embodied as a printed circuit board.

10. The cooling apparatus of claim 1, wherein the cooling medium is a liquid or a gas.

11. The cooling apparatus of claim 10, wherein the liquid is water.

12. The cooling apparatus of claim 10, wherein the gas is air.

13. The cooling apparatus of claim 1, wherein the common side edge defines between the first one of the plurality of side faces and the second one of the plurality of side faces of the semiconductor module an edge angle which has an angle value in an angular range of 30° to 60°.

14. The cooling apparatus of claim 13, wherein the edge angle is 45°.

15. The cooling apparatus of claim 5, wherein the cooling elements have each a maximum cooling element length which is defined from the first face of the base body to the cooling element end of the respective cooling element and which is limited by a cover face distance that extends between the first cover face and the second cover face of the semiconductor module and determines a module height of the semiconductor module.

16. The cooling apparatus of claim 1, wherein the base body has a second face which faces away from the first face of the base body and which is devoid of cooling elements.

17. A converter, comprising:

a converter housing; and a cooling apparatus integrated in the converter housing, said cooling apparatus comprising a semiconductor module comprising a first cover face, a second cover face, with the first cover face facing away from the second cover face, a module space formed between the first and second cover faces, and a plurality of side faces designed to enclose the module space, a heat sink designed to cool the semiconductor module and comprising a base body, cooling elements formed on a first face of the base body and designed to project from the base body, and a cooling medium capable of flowing around the cooling elements and the plurality of side faces of the semiconductor module in a flow direction along the base body, with at least a first one of the plurality of side faces and a second one of the plurality of side faces of the semiconductor module forming a common side edge which faces the flow direction, wherein the semiconductor module is connected to the first face of the base body at the first cover face and designed for embedment between at least some of the cooling elements and designed for embedment between at least some of the cooling elements.

18. The converter of claim 17, further comprising a convection generator designed to generate a forced convection of the cooling medium.

* * * * *